(12) United States Patent
Henning et al.

(10) Patent No.: US 8,049,272 B2
(45) Date of Patent: Nov. 1, 2011

(54) TRANSISTORS HAVING IMPLANTED CHANNEL LAYERS AND METHODS OF FABRICATING THE SAME

(75) Inventors: Jason P. Henning, Carrboro, NC (US); Allan Ward, Durham, NC (US); Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 46 days.

(21) Appl. No.: 11/735,799

(22) Filed: Apr. 16, 2007

(65) Prior Publication Data

US 2007/0292999 A1 Dec. 20, 2007

Related U.S. Application Data

(60) Provisional application No. 60/814,516, filed on Jun. 16, 2006.

(51) Int. Cl.
H01L 29/666 (2006.01)
H01L 29/78 (2006.01)

(52) U.S. Cl. .......................... 257/330; 257/332; 428/172

(58) Field of Classification Search .................. 257/330, 257/332, E29.321, 29.32; 438/172, 169
See application file for complete search history.

(56) References Cited

U.S. PATENT DOCUMENTS

| | | | |
|---|---|---|---|
| 4,757,028 A | 7/1988 | Kondoh | |
| 4,762,806 A | 8/1988 | Suzuki | |
| 5,270,554 A | 12/1993 | Palmour | |
| 5,925,895 A | 7/1999 | Sriram | |
| 6,218,680 B1 | 4/2001 | Carter, Jr. | |
| 6,310,385 B1 * | 10/2001 | Ajit | 257/524 |
| 6,902,964 B2 * | 6/2005 | Sriram | 438/167 |
| 6,906,350 B2 | 6/2005 | Sriram | |
| 6,982,204 B2 * | 1/2006 | Saxler et al. | 438/285 |
| 7,238,560 B2 * | 7/2007 | Sheppard et al. | 438/172 |

OTHER PUBLICATIONS

Yokogawa et al. "Electronic Properties of Nitrogen Delta-Doped Silicon Carbide Layer", Mat. Res. Soc. Symp. Proc. vol. 640. Fall Symposium, 2000.
Konstantinov et al. "Investigation of Lo-Hi-Lo and Delta Doped Silicon Carbide Structure" Mat. Res. Soc. Symp. Proc. vol. 640. Fall Symposium, 2000.
Tucker et al. "Fully Ion Implanted MESFETs in Bulk Semi-Insulating 4H-SiC." Diamond and Related Materials 11, pp. 1344-1348, 2002.
Ogata et al. "RF Characteristics of a Fully Ion-Implanted MESFET on a Bulk Semi-Insulating 4H-SiC Substrate" Mat. Sci. Forum vols. 527-529, pp. 1235-1238, 2006.

* cited by examiner

*Primary Examiner* — Howard Weiss
*Assistant Examiner* — Steven Rao
(74) *Attorney, Agent, or Firm* — Myers Bigel Sibley & Sajovec

(57) ABSTRACT

A MESFET includes a silicon carbide layer, spaced apart source and drain regions in the silicon carbide layer, a channel region positioned within the silicon carbide layer between the source and drain regions and doped with implanted dopants, and a gate contact on the silicon carbide layer. Methods of forming a MESFET include providing a layer of silicon carbide, forming spaced apart source and drain regions in the silicon carbide layer, implanting impurity atoms to form a channel region between the source and drain regions, annealing the implanted impurity atoms, and forming a gate contact on the silicon carbide layer.

30 Claims, 9 Drawing Sheets

TRANSISTORS HAVING IMPLANTED CHANNEL LAYERS AND METHODS OF FABRICATING THE SAME

CROSS-REFERENCE TO RELATED APPLICATION AND CLAIM OF PRIORITY

This application claims the benefit of and priority to U.S. Provisional Patent Application No. 60/814,516, filed Jun. 16, 2006, entitled "TRANSISTORS HAVING IMPLANTED CHANNEL LAYERS AND METHODS OF FABRICATING THE SAME," the disclosure of which is hereby incorporated herein by reference as if set forth in its entirety. This application is related to co-pending and commonly assigned U.S. application Ser. No. 11/700,268 entitled "TRANSISTORS HAVING IMPLANTED CHANNELS AND IMPLANTED P-TYPE REGIONS BENEATH THE SOURCE REGION AND METHODS OF FABRICATING THE SAME" filed Jan. 1, 2007.

STATEMENT OF GOVERNMENT INTEREST

The present invention was made, at least in part, with support from The Office of Naval Research, contract number N00014-02-C-0250. The Government may have certain rights in this invention.

FIELD OF THE INVENTION

The present invention relates to microelectronic devices and more particularly to transistors, for example, metal-semiconductor field-effect transistors (MESFETs).

BACKGROUND

Electrical circuits requiring high power handling capability (>20 watts) while operating at high frequencies, such as radio frequencies (500 MHz), S-band (3 GHz) and X-band (10 GHz), have in recent years become more prevalent. Because of the increased interest in high power, high frequency circuits, there has been a corresponding increase in demand for transistors that are capable of reliably operating at radio frequencies and above while still being capable of handling higher power loads. Previously, bipolar transistors and power metal-oxide semiconductor field effect transistors (MOSFETs) have been used for high power applications, but the power handling capability of such devices may be limited at higher operating frequencies. Junction field-effect transistors (JFETs) have been used for high frequency applications, but the power handling capability of previously known JFETs may also be limited.

Recently, metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affect the operating parameters. Of the characteristics that affect a transistors operating parameters, the electron mobility, saturated electron drift velocity, electric breakdown field and thermal conductivity may have the greatest effect on a transistor's high frequency and high power operational characteristics.

Electron mobility is the measurement of how rapidly an electron is accelerated to its saturated velocity in the presence of an electric field. In the past, semiconductor materials which have a high electron mobility were preferred because more current could be developed with a smaller field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter transit times from source to drain.

Electric breakdown field is the field strength at which breakdown of the Schottky junction occurs, and the current through the gate of the device suddenly increases. A high electric breakdown field material is preferred for high power, high frequency transistors because larger electric fields generally can be supported by a given dimension of material. Larger electric fields allow for faster transients, as the electrons can be accelerated more quickly by larger electric fields than by smaller fields.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase, and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

In the past, high frequency MESFETs have been manufactured of n-type III-V compounds, such as gallium arsenide (GaAs) because of their high electron mobilities. Although these devices provided increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power levels and higher frequencies than devices produced from silicon (Si) or GaAs. The high electric breakdown field of about $4 \times 10^6$ V/cm, high saturated electron drift velocity of about $2 \times 10^7$ cm/sec and high thermal conductivity of about 4.9 W/cm-° K indicate that SiC would be suitable for high frequency, high power applications. Unfortunately, difficulty in manufacturing has limited the usefulness of SiC for high power and high frequency applications.

MESFETs having channel layers of silicon carbide have been produced on silicon substrates (See, e.g., U.S. Pat. Nos. 4,762,806 to Suzuki et al. and 4,757,028 to Kondoh et al.). Because the semiconductor layers of a MESFET may be epitaxial, the layer upon which each epitaxial layer is grown affects the characteristics of the device. Thus, a SiC epitaxial layer grown on a Si substrate generally has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate generally limits the ability of such devices to dissipate heat. Furthermore, the growth of SiC on Si generally results in defects in the epitaxial layers that result in high leakage current when the device is in operation.

Other MESFETs have been developed using SiC substrates. U.S. patent application Ser. No. 07/540,488 filed Jun. 19, 1990 and now abandoned, the disclosure of which is incorporated entirely herein by reference, describes a SiC MESFET having epitaxial layers of SiC grown on a SiC substrate. These devices exhibited improved thermal characteristics over previous devices because of the improved crystal quality of the epitaxial layers grown on SiC substrates. However, to obtain high power and high frequency it may be necessary to overcome the limitations of SiC's lower electron mobility.

Similarly, commonly assigned U.S. Pat. No. 5,270,554 to Palmour describes a SiC MESFET having source and drain contacts formed on n+ regions of SiC and an optional lightly doped epitaxial layer between the substrate and the n-type layer in which the channel is formed. U.S. Pat. No. 5,925,895 to Sriram et al. also describes a SiC MESFET and a structure that is described as overcoming "surface effects" which may reduce the performance of the MESFET for high frequency operation. Sriram et al. also describes SiC MESFETs which use n+ source and drain contact regions as well as a p-type buffer layer.

Furthermore, conventional SiC FET structures may provide nearly constant operating characteristics during the entire operating range of the FET. i.e. from fully open channel to near pinch-off voltage, by using a very thin, highly doped channel (a delta doped channel) offset from the gate by a lightly doped region of similar conductivity type. Delta doped channels are discussed in detail in an article by Yokogawa et al. entitled *Electronic Properties of Nitrogen Delta-Doped Silicon Carbide Layers*, MRS Fall Symposium, 2000 and an article by Konstantinov et al. entitled *Investigation of Lo-Hi-Lo and Delta Doped Silicon Carbide Structure*, MRS Fall Symposium, 2000.

However, one potential problem associated with conventional SiC MESFET designs is that it may be difficult to control the thickness, doping and/or conductivity of the epitaxially grown channel layers. Because of variations in such properties, it may be difficult to reliably fabricate devices having consistent operating characteristics.

SUMMARY

Some embodiments of the invention provide a metal-semiconductor field-effect transistor including a silicon carbide layer, spaced apart source and drain regions in the silicon carbide layer, a channel region positioned beneath a surface of the silicon carbide layer between the source and drain regions and doped with implanted dopants, and a gate contact on the silicon carbide layer.

The transistor may further include a recess in the silicon carbide layer, and the gate contact may be positioned in the recess. The recess may extend into the silicon carbide layer by about 600 Å. Furthermore, the recess may extend into the channel region.

The channel region may have a concentration of implanted dopants of $1 \times 10^{17}$ cm$^{-3}$ or more. For example, the channel region may further have a peak concentration of implanted dopants in a range of from about $3 \times 10^{17}$ cm$^{-3}$ to about $2 \times 10^{18}$ cm$^{-3}$. The peak concentration may be located in a range of from about 100 nm to about 350 nm from a surface of the silicon carbide layer.

The transistor may further include a cap layer on the channel layer, and the gate contact may extend through the cap layer to the silicon carbide layer.

The channel region may include a concentration profile of implanted dopants including multiple implant peaks. For example, the implanted dopants may form a dual peak dopant profile in the channel layer.

The channel region may include a first sublayer, a second sublayer and a third sublayer disposed between the first and second sublayers. The third sublayer may have a dopant concentration less than a dopant concentration of the first sublayer and/or the second sublayer. The gate contact may extend through the first sublayer and into the third sublayer.

In some embodiments, the channel region may include a first sublayer having a first dopant concentration and a second sublayer having a second dopant concentration beneath the first sublayer. The first sublayer may have a higher dopant concentration than the second sublayer. The gate contact may extend into the first sublayer.

The silicon carbide layer may have a thickness of from about 0.5 to about 0.8 μm and may include an unintentionally doped silicon carbide layer. The silicon carbide layer may include an epitaxial silicon carbide layer and/or a bulk silicon carbide layer. In particular, the bulk silicon carbide layer may include a semi-insulating silicon carbide substrate.

The channel region may have a mobility in a range of about 100 cm$^2$/V-s to about 240 cm$^2$/V-s, an implant charge density in a range of about $3 \times 10^{12}$ cm$^{-2}$ to about $2 \times 10^{13}$ cm$^{-2}$, a peak doping in the range of about $3 \times 10^{17}$ cm$^{-3}$ to about $2 \times 10^{18}$ cm$^{-3}$ and/or a sheet resistivity in a range of about 4000 ohms/square to about 7500 ohms/square.

Methods of forming a metal-semiconductor field-effect transistor according to some embodiments of the invention include providing a layer of silicon carbide, forming spaced apart source and drain regions in the silicon carbide layer, implanting impurity atoms to form a channel region beneath a surface of the silicon carbide layer between the source and drain regions, annealing the implanted impurity atoms, and forming a gate contact on the silicon carbide layer.

Implanting impurity atoms may be performed at a temperature above room temperature. For example, implanting impurity atoms may be performed at a temperature of at least about 1100° C.

Annealing the implanted impurity atoms may be performed at a temperature of at least about 1400° C. For example, annealing the implanted impurity atoms may be performed at a temperature of from about 1400° C. to about 1700° C. In particular, annealing the implanted impurity atoms may be performed at a temperature of about 1600° C. Moreover, annealing the implanted impurity atoms may be performed for about 5 minutes to about 30 minutes.

The methods may further include forming a recess in the silicon carbide layer, forming the gate contact may include forming the gate contact in the recess.

The methods may further include forming a cap layer on the silicon carbide layer and forming a recess through the cap layer, and forming the gate contact may include forming the gate contact in the recess. The methods may further include forming a second recess in the silicon carbide layer, and forming the gate contact may include forming the gate contact in the second recess.

The layer of silicon carbide may include an unintentionally doped layer of epitaxial silicon carbide and/or a bulk silicon carbide layer. In particular, the bulk silicon carbide layer may include a semi-insulating silicon carbide substrate.

DETAILED DESCRIPTION OF EMBODIMENTS OF THE INVENTION

The present invention will now be described with reference to the FIGS. 1 through 14, which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a layer being formed on a substrate or other layer. As will be appreciated by those of skill in the art, references to a layer being formed "on" another layer or substrate contemplates that additional layers may intervene. References to a layer being formed on another layer or substrate without an intervening layer are described herein as being formed "directly on" the layer or substrate. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Transistors according to embodiments of the present invention may be useful in, for example, high efficiency linear power amplifiers, such as power amplifiers for base stations using complex modulation schemes such as code division multiple access (CDMA) and/or Wideband CDMA (W-CDMA).

Figure 1:
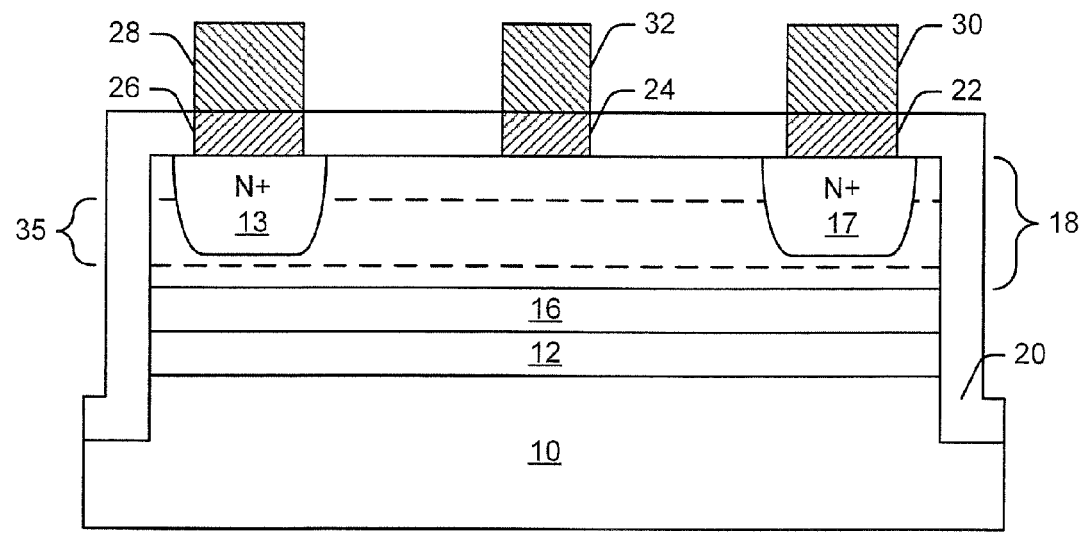
FIGS. 1-4 are cross-sectional views of transistors according to some embodiments of the present invention.

Referring to FIG. 1, transistors, for example, metal-semiconductor field effect transistors (MESFETs), according to some embodiments of the present invention will now be described in detail. As seen in FIG. 1, a substrate 10 is provided. The substrate 10 may be a single crystal bulk silicon carbide (SiC) substrate of either p-type or n-type conductivity or semi-insulating. The substrate 10 of either p-type or n-type may be very lightly doped. The substrate may be formed of silicon carbide having a polytype selected from the group of 6H, 4H, 15R or 3C silicon carbide. Although the present invention is described herein with reference to a SiC substrate, the present invention is not limited to SiC. For example, in some embodiments, the substrate 10 may also include, for example, gallium arsenide (GaAs) and/or Gallium Nitride (GaN). Moreover, devices according to some embodiments of the invention may not have a substrate. For example, some devices may include semiconductor layers removed from a growth substrate and mounted to a carrier substrate and/or a submount.

An optional buffer layer 12 of, for example, p-type silicon carbide may be provided on the substrate 10. The buffer layer 12 may be formed of p-type conductivity silicon carbide of 6H, 4H, 15R or 3C polytype. The buffer layer 12 may, for example, have a carrier concentration of from about $2 \times 10^{15}$ $cm^{-3}$ to about $6 \times 10^{15}$ $cm^{-3}$. Suitable dopants include aluminum, boron and/or gallium. The buffer layer 12 may have a thickness of about 2 μm. Although the buffer layer 12 is described above as p-type silicon carbide, the invention is not limited to this configuration. Alternatively, the buffer layer 12 may be undoped silicon carbide (i.e. unintentionally doped) or very low-doped n-type conductivity silicon carbide. If a very low doped n-type silicon carbide is utilized for the buffer layer 12, the carrier concentration of the buffer layer 12 is preferably less than about $5 \times 10^{14}$ $cm^{-3}$.

The buffer layer 12 may be disposed between the substrate 10 and a second buffer layer 16. The second buffer layer 16 may be, for example, p-type silicon carbide having a carrier concentration of from about $1 \times 10^{16}$ $cm^{-3}$ to about $5 \times 10^{16}$ $cm^{-3}$, but typically about $1.5 \times 10^{16}$ $cm^{-3}$. The p-type silicon carbide buffer layer 16 may also have a thickness of from about 0.5 μm or less to about 1 μm. Although the second buffer layer 16 is described above as being of p-type conductivity silicon carbide, it will be understood that the present invention is not limited to this configuration. Alternatively, for example, the second buffer layer 16 may be of n-type conductivity, for example, very lightly doped n-type conductivity SiC or undoped SiC as discussed above with respect to the buffer layer 12. In some embodiments of the present invention, the second buffer layer 16 may be provided directly on the substrate 10. A channel layer 18 is provided on the second buffer layer 16, as illustrated in FIG. 1. The channel layer 18 may be formed of silicon carbide having a 6H, 4H 15R or 3C polytype and may be undoped and/or unintentionally doped. As used herein, "unintentionally doped" means that dopant atoms are not intentionally introduced into the layer during growth. However, some background dopant impurities may be present in the layer.

After formation of the channel layer 18, n-type impurity atoms such as nitrogen and/or phosphorus are implanted into the channel layer 18 to form an implanted channel region 35 therein. The implanted channel region 35 may have a dopant concentration greater than about $1 \times 10^{17}$ cm$^{-3}$, and may have a peak dopant concentration in a range of from about $3 \times 10^{17}$ cm$^{-3}$ to about $2 \times 10^{18}$ cm$^{-3}$. In particular embodiments, the implanted channel region 35 may have a peak dopant concentration of about $1 \times 10^{18}$ cm$^{-3}$. The implanted channel region may have a thickness of from about 50 nm to about 300 nm. In particular embodiments, the implanted channel region 35 has a thickness of about 100 nm. The peak concentration of implanted dopant atoms may be located about 60 nm to 200 nm from the surface of the channel layer 18. In particular embodiments, the peak concentration of implanted dopant atoms may be located about 150 nm from the surface of the channel layer 18.

Conventionally, implanted channel layers have not been used in SiC MESFETs because of the reduced carrier mobility resulting from damage to the semiconductor lattice caused by the implantation process. However, embodiments of the present invention may employ a low-damage implant process to form implanted channel regions 35 having acceptable mobility, sheet resistance and/or other properties.

Since the channel region 35 of a device according to some embodiments of the invention is implanted, many different dopant profiles can be accurately and repeatably created within the channel layer 18. Accordingly, operational properties of MESFET devices according to some embodiments of the invention may be more accurately controlled and/or engineered compared to conventional MESFET structures in which the channel region is doped during epitaxial growth.

For example, delta doping of channels may be accomplished more accurately and reliably according to some embodiments of the invention. Furthermore, in some embodiments according to the invention, the implanted channel region 35 may have a dual peak configuration. That is, the implanted channel region 35 may include a pair of dopant concentration peaks formed in multiple implant steps and spaced apart from one another to provide a channel region having first, second and third sub-layers similar to the structure described in commonly assigned U.S. patent application Ser. No. 10/136,456 to Sriram, the disclosure of which is incorporated herein by reference as if set forth in its entirety. In brief, the more highly doped regions near the concentration peaks may act as carrier supply regions for the central region of relatively low dopant concentration between the two dopant peaks. The central region may have increased mobility compared to the more highly doped regions, which may result in improved device performance.

Ion implantation is a well-known method of doping a semiconductor layer with impurities. Ion implantation is useful for selective doping of crystalline material in order to form desired regions in the material, such as p-n junctions, highly conductive contact regions, field spreading regions, etc. In an ion implantation process, ionized impurity atoms are accelerated through an electric field towards a target layer, where they become embedded. The number of ions directed at a target layer is referred to as the dose, which is typically expressed in ions/cm$^2$. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. In each implant step, the implanted ions typically form a concentration distribution that has a peak concentration at a particular depth (i.e., the "implant range"). Multiple implant steps may be performed using different implant conditions to build up a desired dopant concentration profile.

Typically, after impurities are implanted into a semiconductor layer, it is desirable to anneal the implanted impurities at a high temperature, i.e. a so-called activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors.

In some embodiments of the invention, implantation of ions to form implanted channel region 35 may be performed at relatively low implant energies and/or doses, and/or at relatively high temperatures in order to provide an implanted channel region 35 having acceptable mobility. For example, the implanted channel region 35 may be formed by implanting ions with an implant energy of 90 keV or less and/or with a dose of $9 \times 10^{12}$ atoms/cm$^2$ or less.

Furthermore, the implants may be performed at an elevated temperature, for example, at a temperature greater than about 350° C. In particular embodiments, the implants may be performed at a temperature of about 1100° C. By performing the implants at an elevated temperature, lattice damage that may occur during the implantation process may be annealed out as it occurs. Accordingly, the crystal quality of the implanted region may be maintained, or even improved, during the implantation process.

After implantation of dopants into the channel layer 18 to form the implanted channel region 35, an activation anneal may be performed at a temperature in a range of about 1400° C. to about 1700° C. for about 5 minutes to about 30 minutes. Following the activation anneal, the implanted channel layer 35 may have excellent crystal quality. For example, the implanted channel layer 35 may have lattice damage that is below the threshold at which the lattice damage may affect the mobility of the layer.

As further illustrated in FIG. 1, n$^+$ regions 13 and 17 are provided in the source and drain regions of the device, respectively. As used herein, "p$^+$" or "n$^+$" refer to regions that are defined by higher carrier concentrations than are present in adjacent or other regions of the same or another layer or substrate. Regions 13 and 17 are typically of n-type conductivity silicon carbide and have carrier concentrations that are greater than the carrier concentration of the channel layer 18. For the n$^+$ regions 13 and 17, carrier concentrations of about $1 \times 10^{19}$ cm$^{-3}$ may be suitable, but carrier concentrations as high as possible may be advantageous.

The n$^+$ regions 13 and/or 17 may extend to/into the implanted channel layer 35 as illustrated in FIG. 1.

Ohmic contacts 26 and 22 are provided on the implanted regions 13 and 17, respectively, and are spaced apart so as to provide a source contact 26 and a drain contact 22. The ohmic contacts 26 and 22 are preferably formed of nickel and/or other suitable metals. An insulator layer 20, such as an oxide, may be further provided on the exposed surface of the device to provide mechanical protection and electrical isolation to the exposed surface of the device, as well as to passivate unterminated chemical bonds on the surfaces of the semiconductor layers.

Figure 2:
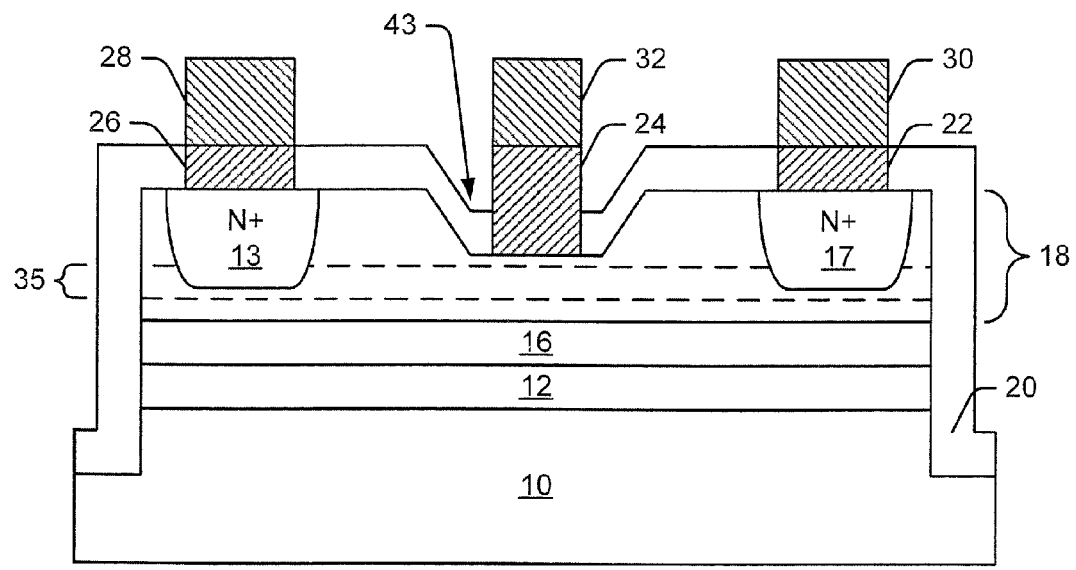
Figure 3:
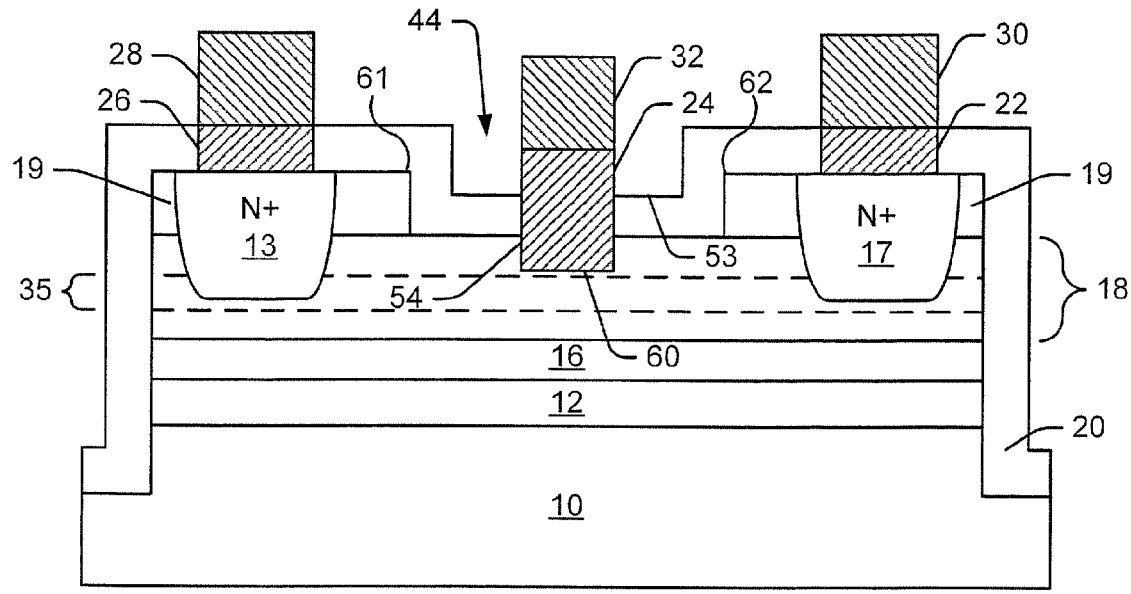

Referring again to FIG. 1, the gate contact 24 may be provided on the channel layer 18 between the source region 13 and the drain region 17. In some embodiments of the present invention, the gate contact 24 may be provided in a recess 43 in the channel layer 18 as illustrated in FIG. 2. Furthermore, as described below, a cap layer 19 may be provided on the channel layer 18 as illustrated in FIG. 3, and the gate may be formed in a double recess (i.e. a first recess 44 through a cap layer 19 and a second recess 54 into the channel layer 18).

The gate contact 24 may be formed of chromium, platinum, platinum silicide, nickel, gold, and/or TiWN, however, other metals known to one skilled in the art to form Schottky contacts to SiC, may be used. The Schottky gate contact 24 typically has a three layer structure. For example, the gate contact 24 can optionally include a first gate layer of chromium (Cr) contacting the n-type conductivity channel layer 18. Such a structure may have advantages because of the high adhesion of chromium (Cr). The gate contact 24 may farther include an overlayer of platinum (Pt) and gold 32 or other highly conductive metal. Alternatively, the gate contact 24 may include a first layer of nickel in the first recess 43 on the channel layer 18. The gate contact 24 may further include an overlayer on the first layer of nickel that includes a layer of gold.

As further illustrated in FIG. 1, metal overlayers 28, 30 and 32 may be provided on the source contacts 26, the drain contact 22 and the gate contact 24, respectively. The overlayers 28, 30 and 32 may be gold, silver, aluminum, platinum and/or copper. Other suitable highly conductive metals may also be used for the overlayers.

In selecting the dimensions of the MESFET, the width of the gate is defined as the dimension of the gate perpendicular to the flow of current. As shown in the cross-section of FIG. 1, the gate width runs into and out of the page. The length of the gate is the dimension of the gate parallel to the flow of electrons from the source 13 to the drain 17. The gate length is the dimension of the gate 24 that is in contact with the channel layer 18. For example, the gate length of the MESFET according to certain embodiments of the present invention may be from about 0.4 µm to about 0.7 µm. Another important dimension is the source to gate distance, i.e., the distance from the n⁺ source region 13 to the gate contact 24. The source to gate distance according to certain embodiments of the present invention may be from about 0.5 µm to about 0.7 µm. Furthermore, the distance from the n⁺ drain region 17 to the gate 24 may be from about 1.5 µm to about 2 µm. Embodiments of the present invention may further include a plurality of unit cells of MESFETs, and the distance from a first gate of the unit cells to a second gate may be, for example, from about 20 µm to about 50 µm.

Referring now to FIG. 2, a cross-sectional view of a transistor according to further embodiments of the present invention will be discussed. Like numbers refer to like elements in previously described figures, thus, detailed descriptions of these elements will be omitted. As seen in FIG. 2, transistors according to certain embodiments of the present invention include a first recess 43 in the channel layer 18. The first recess 43 is provided between first and second no regions 13 and 17, i.e. between the source region and the drain region of the device. The first recess 43 extends into the channel layer 18. In some embodiments, the first recess 43 may extend towards, but not into, the implanted channel region 35. In other embodiments, the first recess 43 may extend to and/or into, the implanted channel layer 35.

The first recess 43 may be formed by partially etching the channel layer 18. The first recess 43 may be formed by an etching process, such as a dry or wet etch process. For example, the first recess 43 may be formed by dry etching, for example, Electron Cyclotron Resonance (ECR) or Inductively Coupled Plasma (ICP) etching. Techniques for etching silicon carbide are well known in the art and need not be described further herein. Since the conductivity and/or the location of the implanted channel layer 35 may be more accurately controlled by utilizing embodiments of the present invention, etching the channel layer 18 may be more easily performed. For example, a timed etch may be performed to form the first recess 43, which may avoid the need for repeatedly etching the recess and testing the sheet resistance of the channel region after each iteration to determine if the etch process should be repeated.

Referring now to FIG. 3, a cross-sectional view of a transistor according to further embodiments of the present invention will be discussed. Like numbers refer to like elements in previously described figures, thus, detailed descriptions of these elements will be omitted. As seen in FIG. 3, transistors according to some embodiments of the present invention may include a double recessed structure containing first and second recesses as illustrated in FIG. 3. In particular, an n-type silicon carbide cap layer 19 may be formed on the channel layer 18. A first recess 44 has a floor 60 that extends through the cap layer 19 to the channel layer 18. A second recess 54 into the channel layer 18 is provided between the sidewalls 61, 62 of the first recess. A first sidewall 61 of the first recess 44 is between the source 26 and the gate 24 and a second sidewall 62 of the first recess 44 is between the drain 22 and the fate 24. The floor of the second recess 54 extends into the channel layer 18 by, for example, a distance of about 600 Å. The double recessed structure is discussed further in commonly assigned U.S. patent application Ser. No. 10/136,456 to Sriram. According to some embodiments of the invention, the second recess 54 may extend into the channel layer 18 but not into the implanted channel layer 35. In other embodiments, the first recess 44 may extend to and/or into the implanted channel layer 35.

The cap layer 19 may have, for example, a carrier concentration of about $1 \times 10^{16}$ cm$^{-3}$ and a thickness of about 900 Å.

Figure 4:
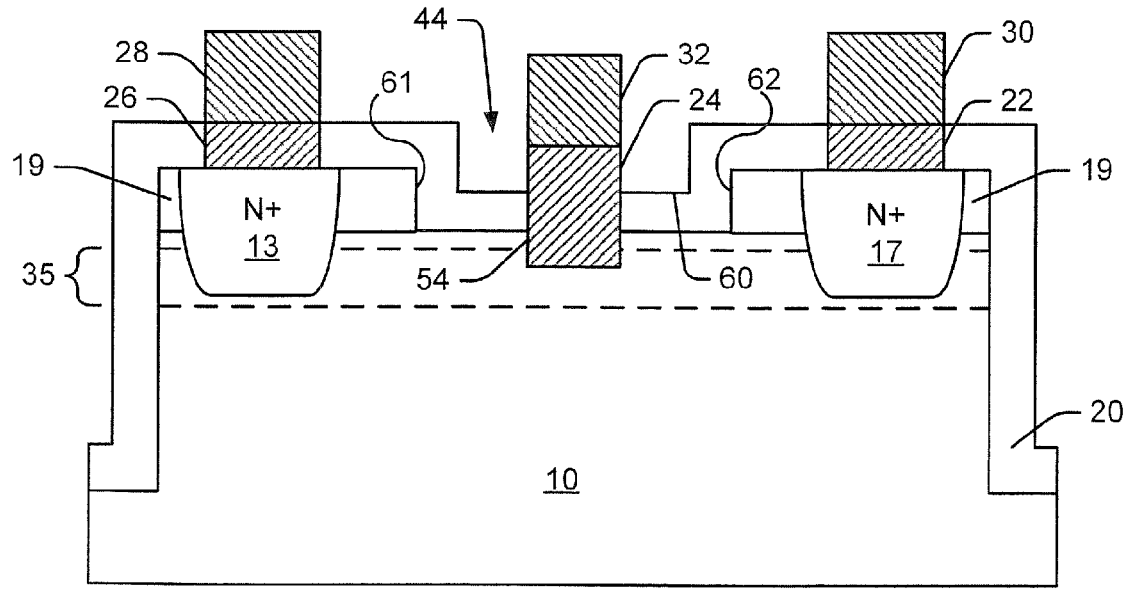

Referring now to FIG. 4, a cross-sectional view of a transistor according to further embodiments of the present invention will be discussed. Like numbers refer to like elements in previously described figures, thus, detailed descriptions of these elements will be omitted. As seen in FIG. 4, in some embodiments, an implanted channel region 35 may be formed in a silicon carbide substrate 10. Moreover, as the cap layer 19 is optional, fabrication of SiC MESFETs may be greatly simplified, as the device may be formed without the necessity of forming epitaxial layers on a growth substrate. In the embodiments of FIG. 4, the substrate 10 may be a semi-insulating silicon carbide substrate fabricated as described in commonly assigned U.S. Pat. No. 6,218,680 to Carter et. al. entitled "Semi-insulating Silicon Carbide Without Vanadium Domination", the disclosure of which is hereby incorporated by reference herein as if set forth in its entirety. Such a semi-insulating substrate may be produced by providing silicon carbide substrates with sufficiently high levels of point defects and sufficiently matched levels of p-type and n-type dopants such that the resistivity of the silicon carbide substrate is dominated by the point defects. Such a domination may be accomplished by fabricating the silicon carbide substrate at elevated temperatures with source powders that have concentrations of heavy metals, transition elements or other deep level trapping elements of less than about $1 \times 10^{16}$ cm$^{-3}$ and preferably less than about $1 \times 10^{14}$ cm$^{-3}$. For example, source powder temperatures between about 2360° C. and 2380° C. with the seed being about 300° C. to about 500° C. lower may be utilized. Thus, it is preferred that the semi-insulating substrate be substantially free of heavy metal, transition element dopants or other deep level trapping elements, such as vanadium, such that the resistivity of the substrate is not dominated by such heavy metals or transition elements. While it is preferred that the semi-insulating substrate be free of such heavy metal, transition element dopants or deep level trapping elements, such elements may be present in measurable amounts while still benefiting from the teachings of the present invention if the presence of such materials does not substantially affect the electrical properties of the MESFETs described herein.

Figure 5A:
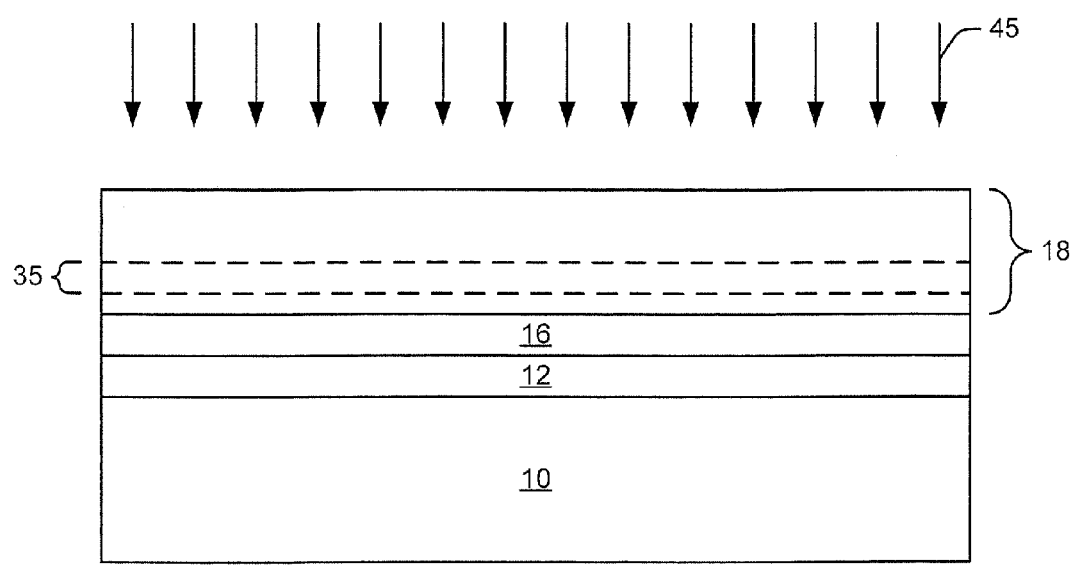
FIGS. 5A through 5D illustrate processing steps in the fabrication of transistors according to some embodiments of the present invention.

FIGS. 5A through 5D illustrate the fabrication of FETs according to some embodiments of the present invention. As seen in FIG. 5A, an optional buffer layer 12 may be grown or deposited on a substrate 10. The substrate 10 may be a semi-insulating SiC substrate, a p-type substrate or an n-type substrate. The substrate 10 may be very lightly doped. The buffer layer 12 may be of p-type conductivity silicon carbide having a carrier concentration of about $3 \times 10^{15}$ cm$^{-3}$ or less, but typically $1 \times 10^{15}$ cm$^{-3}$ or less. Alternatively, the buffer layer 12 may be n-type silicon carbide or undoped silicon carbide. If the substrate 10 is semi-insulating it may be fabricated as described in U.S. Pat. No. 6,218,680 discussed above.

As further illustrated in FIG. 5A, a second buffer layer 16 and an unintentionally doped channel layer 18 are grown or deposited on the buffer layer 12. It will be understood that if the buffer layer 12 is not included, the second buffer layer 16 and the channel layer 18 may be grown or deposited on the substrate 10. The second buffer layer 16 is formed on the buffer layer 12 and the channel layer 18 is formed on the second buffer layer 16 as illustrated in FIG. 5A.

As further illustrated in FIG. 5A, first impurity atoms 45 are implanted into the channel layer 18 to form the implanted channel region 35. The first impurity atoms 45 may be implanted in a single implant step and/or in multiple implant steps. For example, the implanted channel region 35 may be formed by implanting ions with an implant energy of 90 keV or less and/or with a dose of $9 \times 10^{12}$ atoms/cm$^2$ or less.

Furthermore, the implants may be performed at an elevated temperature, for example, at a temperature greater than about 350° C. In particular embodiments, the implants may be performed at a temperature of about 1100° C.

After implantation of dopants into the channel layer 18 to form the implanted channel region 35, an activation anneal may be performed at a temperature in a range of about 1400° C. to about 1700° C. for about 5 minutes to about 30 minutes. Following the activation anneal, the implanted channel layer 35 may have excellent crystal quality. For example, the implanted channel layer 35 may have lattice damage that is below the threshold at which the lattice damage may affect the mobility of the layer. For example, the implanted channel layer 35 may have a conductivity mobility in excess of 150 cm$^2$/V-s. In some embodiments, the implanted channel layer 35 may have a conductivity mobility in excess of 200 cm$^2$/V-s.

Figure 5B:
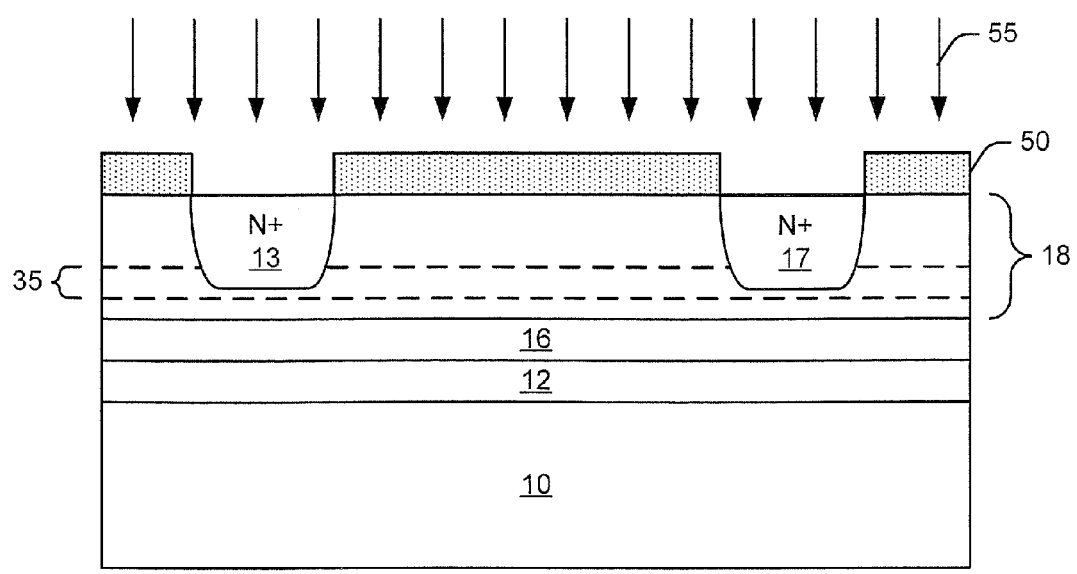

As illustrated in FIG. 5B, a mask 50 may be formed for implanting the n$^+$ regions 13 and 17. Regions 13 and 17 are typically formed by ion implantation of second impurity atoms 55 of, for example, nitrogen A) or phosphorus (P), followed by a high temperature anneal. Suitable anneal temperatures may be from about 1100° C. to about 1600° C. The implanted channel region 35 and the implanted regions 13 and 17 may be annealed simultaneously. The ion implantation may be performed on the regions which are not covered by the mask 50 to form n$^+$ regions 13 and 17 as illustrated in FIG. 5B. Thus, the ions are selectively implanted into portions of the channel layer 18 to provide highly doped regions of n-type conductivity, for example, n-type conductivity SiC, having relatively high carrier concentrations.

Figure 5C:
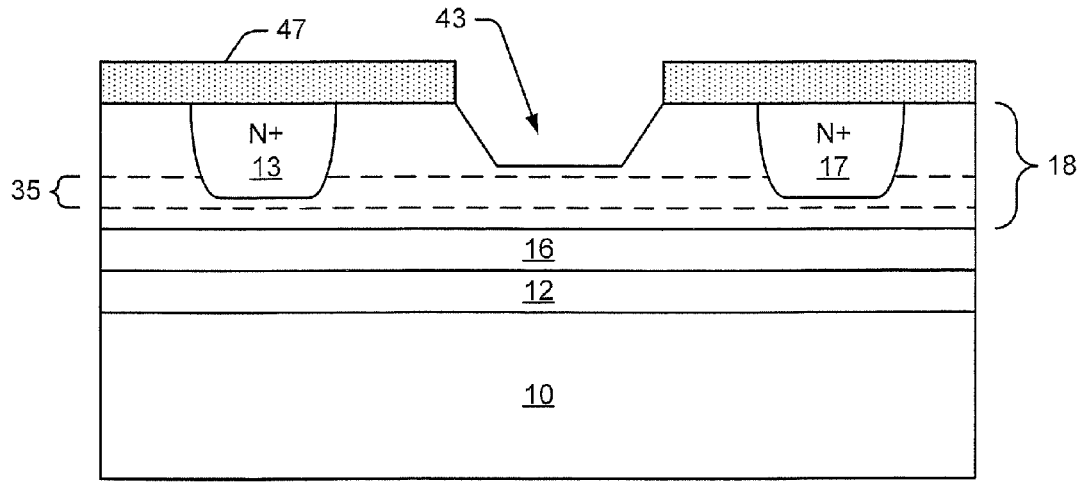

FIG. 5C illustrates the formation of a first recess 43 of the MESFET. The first recess 43 may be formed by forming a mask 47 on the channel layer 18, and then partially etching through the channel layer 18 to form the first recess 43 according to the mask 47. The first recess 43 may be formed by an etching process, such as a dry or wet etch process. For example, the first recess 43 may be formed by dry etching, for example, Electron Cyclotron Resonance (ECR) or Inductively Coupled Plasma (ICP) etching. The mask 47 may be removed.

As discussed above, embodiments of the present invention may include a double recessed structure instead of the single recess 43. As illustrated in FIG. 3, a first recess 44 of the double recessed structure may be formed by forming a mask for the first recess 44 and etching through the cap layer 19 to form the first recess 44 according to the mask. An insulation layer may be formed after the first recess 44 has been formed. After forming the source/drain ohmic contacts, a second recess 54 of the double recessed structure may be formed by forming a second mask for the second recess and etching the recess according to the mask. The channel layer 18 may be etched into a distance of for example, about 600 Å to form the second recess 54. Methods of fabricating a double recessed structure are discussed further in commonly assigned U.S. patent application Ser. No. 10/136,456 to Sriram.

Figure 5D:
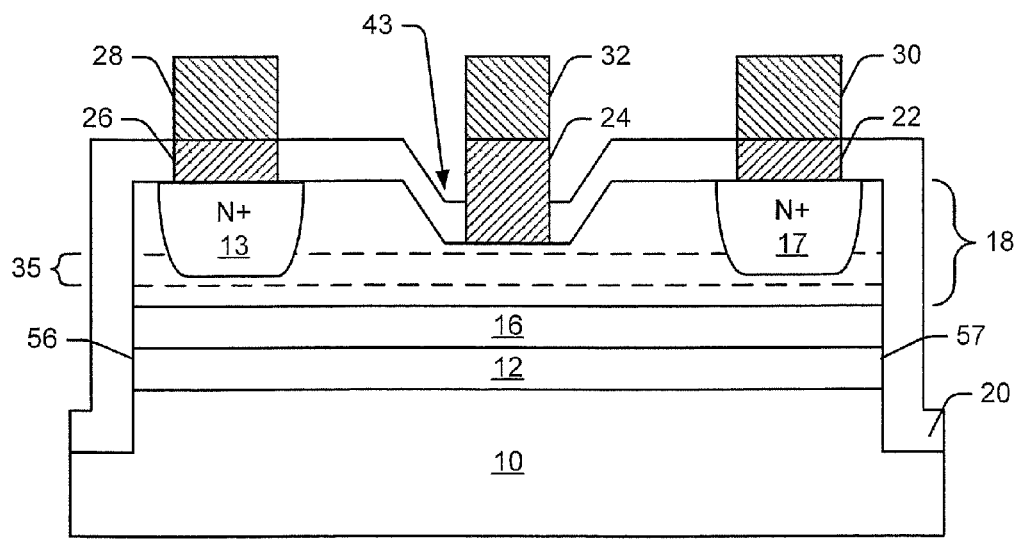

As seen in FIG. 5D, the substrate 10, the buffer layer 12, the second buffer layer 16 and the n-type conductivity channel layer 18 may be etched to form an isolation mesa. The mesa has sidewalls 56, 57 defined by the substrate 10, the buffer layer 12, the second buffer layer 16 and the channel layer 18 that define the periphery of the transistor. The mesa may be formed to extend into the substrate 10 of the device as shown in FIG. 5D. The mesa may extend past the implanted channel region 35 of the device to confine current flow in the device to the mesa and reduce the capacitance of the device. The mesa is preferably formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

In certain embodiments, only the second buffer layer 16 and the channel layer 18 may be etched to form an isolation mesa. In these embodiments, the sidewalls 55, 57 are defined by the second buffer layer 16 and the channel layer 18, which define the periphery of the transistor.

FIG. 5D further illustrates the formation of an insulator layer 20, for example, an oxide layer, after the first recess 43 has been formed as discussed above. The insulator layer 20 may be grown or deposited over the exposed surface of the existing structure, i.e. on the isolation mesa, n$^+$ re-ions 13 and 17, the channel layer 18 and in the first recess 43. The oxidation process may remove, for example, SiC that may have been damaged by the etch process and may also smooth out roughness that may have been created on the surface by the etch.

As further illustrated in FIG. 5D, contact windows may be etched through the insulator layer 20 to the n$^+$ regions 13 and 17. An ohmic metal such as nickel may then be evaporated to deposit the source and drain contacts 26 and 22, respectively. The nickel may be annealed to form the ohmic contacts 26 and 22 as illustrated in FIG. 5D. Such a deposition and annealing process may be carried out utilizing conventional techniques known to those of skill in the art. For example, the ohmic contacts 26 and 22 may be annealed at a temperature of from about 650° C. to about 100° C. for about 2 minutes.

However, other times and temperatures may also be utilized. Times from about 30 seconds to about 10 minutes may be acceptable.

FIG. 5D further illustrates the formation of the gate contact 24 and the overlayers 28, 30 and 32. For example, a window may be opened in the insulator 20 and a layer of a Schottky metal such as chromium may be deposited in the first recess 43. Typically, the chromium layer is formed by evaporation. The gate structure may then be completed by deposition of tin, platinum and/or gold overlayers. As will also be appreciated by those of skill in the art, the overlayers 28 and 30 may be formed either before or after formation of the gate structure. In fact, if a titanium/platinum/gold structure is utilized, the platinum and gold portions of the overlayer may be formed in the same processing steps as the platinum and gold portions 32 of the gate structure. Accordingly, the overlayers 28 and 30 may be formed prior to the formation of a gate contact or after the formation of a gate contact. Alternatively, as discussed above, the device may include a double recess structure and the gate may be disposed within the double recessed structure.

Since the channel region 35 of a device according to some embodiments of the invention is implanted, many different dopant profiles can be accurately and repeatably created within the channel region 35. Accordingly, operational properties of MESFET devices according to some embodiments of the invention may be more accurately controlled and/or engineered compared to conventional MESFET structures in which the channel region is doped during epitaxial growth.

Figure 6:
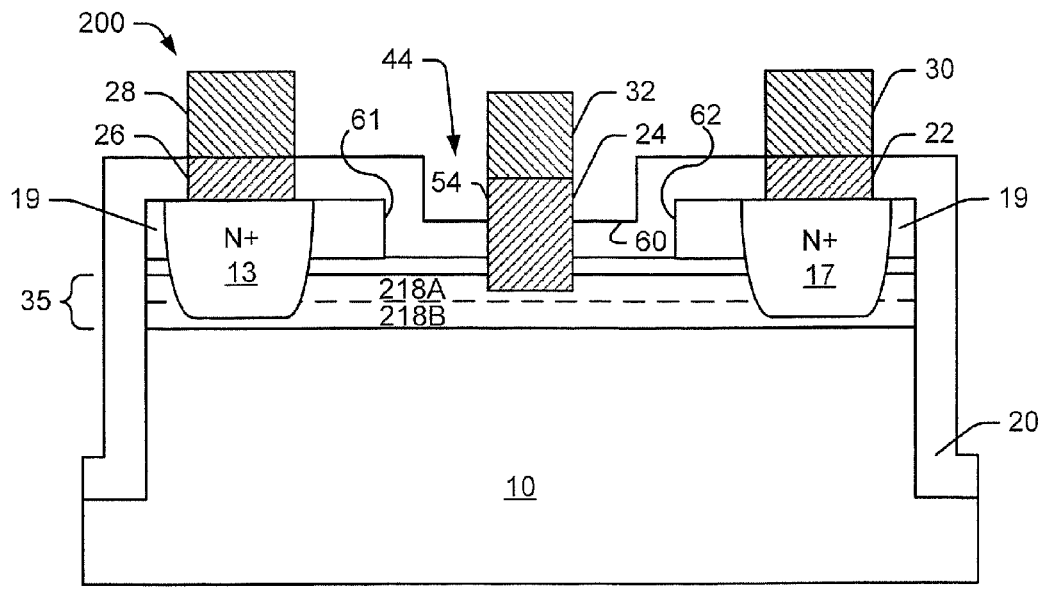
FIGS. 6-7 are cross-sectional views of transistors according to some embodiments of the present invention.

For example, referring to FIG. 6, a device 200 according to some embodiments of the invention may include an n-type conductivity channel region 35 including a first n-type conductivity sublayer 218A and a second n-type conductivity sublayer 218B beneath the first n-type conductivity sublayer 218A. The gate contact 24 may extend into the first n-type conductivity sublayer 218A. The first n-type conductivity sublayer 218A may have a higher dopant concentration than the second n-type conductivity sublayer 218B.

Moreover, a double recessed structure may be used, such as is described in commonly assigned U.S. patent application Ser. No. 10/136,456 to Sriram, the disclosure of which is incorporated herein by reference as if set forth herein.

Figure 7:
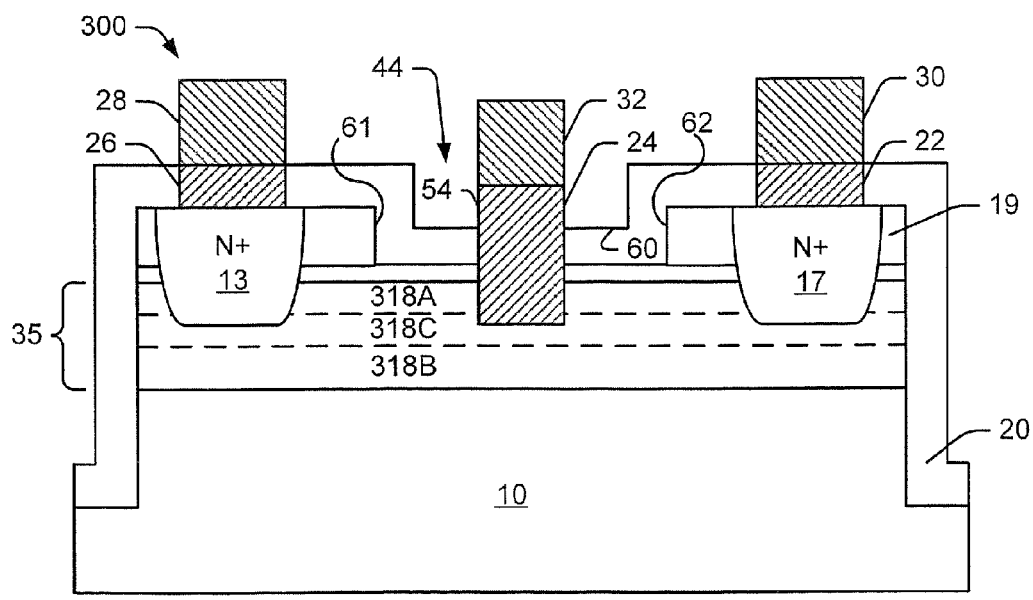

In further embodiments, the n-type conductivity channel region 35 may include first, second and third layers of n-type conductivity SiC as described in commonly assigned U.S. patent application Ser. No. 10/136,456 to Sriram, the disclosure of which is incorporated herein by reference as if set forth in its entirety. For example, as shown in FIG. 7, a device 300 includes an n-type channel region 35 that includes a first sublayer 318A, a second sublayer 318B and a third sublayer 318C disposed between the first and second sublayers 318A, 318B.

Delta doping of channels may be accomplished more accurately and/or reliably according to some embodiments of the invention. For example, the implanted channel region 35 of the device 300 may have a dual peak configuration. That is, the implanted channel region 35 may include a pair of dopant concentration peaks formed in multiple implant steps corresponding to the first and second n-type conductivity sublayers 318A, 318B. The first and second n-type conductivity sublayers 318A, 318B may be spaced apart from one another to provide a channel region having first, second and third sublayers 318A, 318B, 318C similar to the structure described in the above-referenced U.S. patent application Ser. No. 10/136, 456. The first sublayer 318A may have a first dopant concentration, the second sublayer 318B may have a second dopant concentration, and the third sublayer 318C disposed between the first and second sublayers 318A, 318B may have a third dopant concentration that is less than the first and second dopant concentrations. In brief, the more highly doped regions (i.e. the first and second sublayers 318A, 318B) near the concentration peaks may act as carrier supply regions for the central sublayer 318C of relatively low dopant concentration between the two dopant peaks. The centrally located third sublayer 318C may have increased mobility compared to the more highly doped first and second sublayers 318A, 318B, which may result in improved device performance. The gate contact 24 may extend to/into the third sublayer 318C.

EXPERIMENTAL

Figure 8:
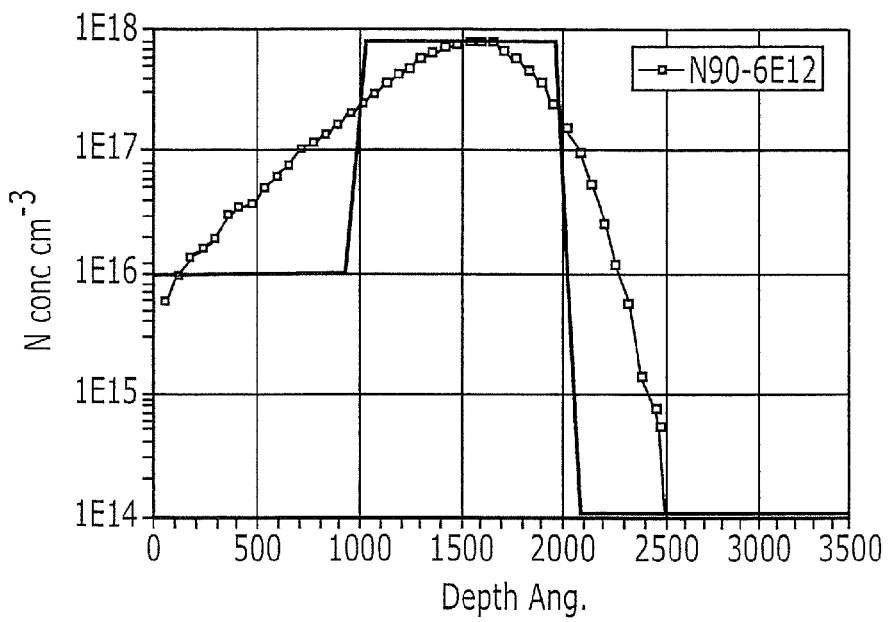
FIG. 8 is a graph of TRIM simulation results for ion implantation according to some embodiments of the invention.
Figure 9:
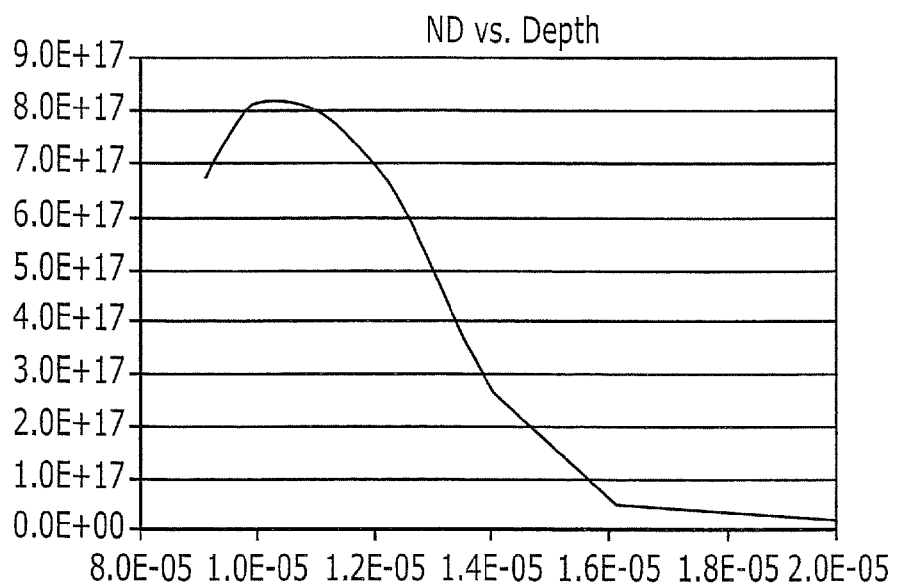
FIG. 9 is a graph of an implant doping profile calculated from capacitance-voltage measurements.

Implantation of n-type dopant atoms into silicon carbide layers was performed using various implant conditions. In one experiment, a dose of $6 \times 10^{12}$ cm$^{-2}$ nitrogen atoms was implanted into three silicon carbide wafers, each of which included a 0.7 μm thick unintentionally doped epitaxial layer of 4H polytype silicon carbide. The nitrogen implants were performed at 90 keV at a temperature of approximately 1100° C. After implantation, the wafers were annealed at about 1600° C. to activate the implants. A TRIM simulation of the implantation is shown in FIG. 8. As shown therein, the simulated implant profile has a peak concentration of about $7 \times 10^{17}$ cm$^{-3}$ at a depth of about 1600 Å (160 nm). After a sacrificial oxidation and BCl$_3$ etch, about 200 Å of material at the surface was removed. Capacitance-Voltage (C-V) measurements were performed on the implanted layers using a mercury probe. From the C-V measurements, a doping profile of an implanted channel region was calculated. The resulting doping profile is shown in FIG. 9. As is apparent from FIG. 9, the measured doping profile shows excellent agreement with the simulated doping profile after-accounting for material loss due to the sacrificial oxidation/BCl$_3$ etch.

A total charge of $5 \times 10^{12}$ cm$^{-2}$ in the implanted region was calculated from the C-V data. In addition, Lehighton conductance measurements performed on the layer revealed a typical sheet resistance ($R_{SH}$) of 5700 ohms/square. The pinch-off (depletion) voltage of the implanted channel region was measured to be about 12V.

Conductivity mobility of the implanted channel region was calculated from the total charge and $R_{SH}$ values as follows:

$$\mu = \frac{1}{(R_{SH} \cdot Q \cdot q)}$$

The implanted channel regions had an average conductivity mobility value of 234 cm$^2$V-s, which compares favorably with conductivity mobility of similar layers formed using epitaxial doping.

Figure 10:
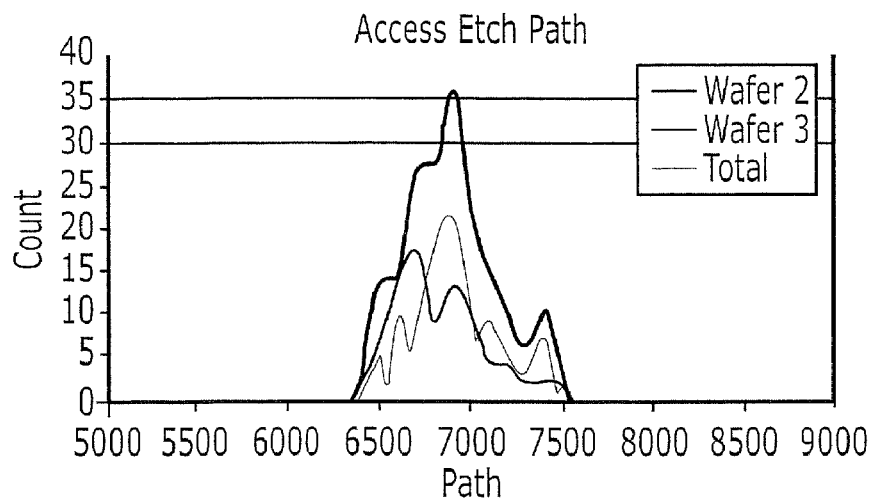
FIG. 10 is a histogram of the measured sheet resistance values for wafers implanted in accordance with some embodiments of the invention.

Gate recesses were etched using an NF$_3$ ICP etch in the first wafer (W1) for 85 seconds, and the sheet resistance $R_{SH}$ of the implanted channel region was measured to be about 8900 ohms/square. The other two wafers (W2 & W3) were etched for 70 seconds using an NF$_3$ ICP etch. The sheet resistance of wafers W1 and W2 after recess etch was measured to be about 6800 ohms/square on average. A histogram of the measured sheet resistance values for wafers W2 and W3 is shown in FIG. 10.

The sheet resistance results for wafers W2 and W3 are summarized in Table 1.

TABLE 1

Sheet Resistance

|  | W2 | W3 | Combined |
|---|---|---|---|
| Average $R_{SH}$ (ohms/square) | 6833 | 6898 | 6866 |
| Std. Deviation | 298 | 247 | 275 |

Figure 11:
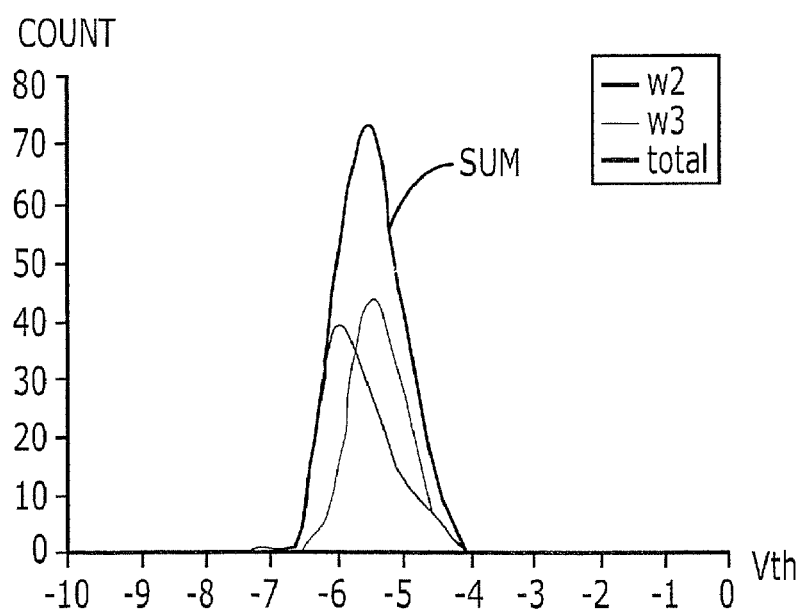
FIG. 11 is histogram of measured threshold voltages for wafers implanted in accordance with some embodiments of the invention.

T-top gates were formed in the etched recesses of each of the second and third wafers W2 and W3, and threshold voltages Vth for each of the channels was measured. A histogram of the measurement results is shown in FIG. 11. As shown in FIG. 11, the wafers exhibited little statistical variation in Vth across each wafer and from wafer to wafer.

The threshold voltage measurements for wafers W2 and W3 are summarized in Table 2.

TABLE 2

Threshold Voltage

|  | W2 | W3 | Combined |
|---|---|---|---|
| Average Vth (volts) | −5.86 | −5.58 | −5.73 |
| Std. Deviation | 0.48 | 0.37 | 0.45 |

In a separate experiment, four quadrants of a semi-insulating HPSI wafer were implanted with nitrogen using four different implant conditions. Each quadrant was implanted with ions at both 30 keV and 60 keV energy levels. All implants were performed at a temperature of about 1100° C. The implanted wafer was annealed at about 1600° C. for about 5 minutes.

The total dose at 30 keV and 60 keV ($4 \times 10^{12}$ cm$^{-2}$ and $9 \times 10^{12}$ cm$^{-2}$, respectively) for Quadrants 1 and 3 was the same. However, Quadrant 1 received one dose of $4 \times 10^{12}$ cm$^{-2}$ at 30 keV and one dose of $9 \times 10^{12}$ cm$^{-2}$ at 60 keV, while Quadrant 3 received two doses of $2 \times 10^{12}$ cm$^{-2}$ at 30 keV and two doses of $4.5 \times 10^{12}$ cm$^{-2}$ at 60 keV. Quadrant 4 received one dose of $2 \times 10^{12}$ cm$^{-2}$ at 30 keV and one dose of $4.5 \times 10^{12}$ cm$^{-2}$ at 60 keV. Quadrant 2 received one dose of $2 \times 10^{12}$ cm$^{-2}$ and one dose of $4 \times 10^{12}$ cm$^{-2}$ at 30 keV, and one dose of $4.5 \times 10^{12}$ cm$^{-2}$ and one dose of $9 \times 10^{12}$ cm$^{-2}$ a at 60 keV. The total doses of the four quadrants are summarized in Table 3.

TABLE 3

Implant Conditions - Total Doses

|  | Total Dose at 30 keV (cm$^{-2}$) | Total Dose at 60 keV (cm$^{-2}$) |
|---|---|---|
| Quadrant 1 | $4 \times 10^{12}$ | $9 \times 10^{12}$ |
| Quadrant 2 | $6 \times 10^{12}$ | $1.5 \times 10^{13}$ |
| Quadrant 3 | $4 \times 10^{12}$ | $9 \times 10^{12}$ |
| Quadrant 4 | $2 \times 10^{12}$ | $4.5 \times 10^{12}$ |

Figure 12:
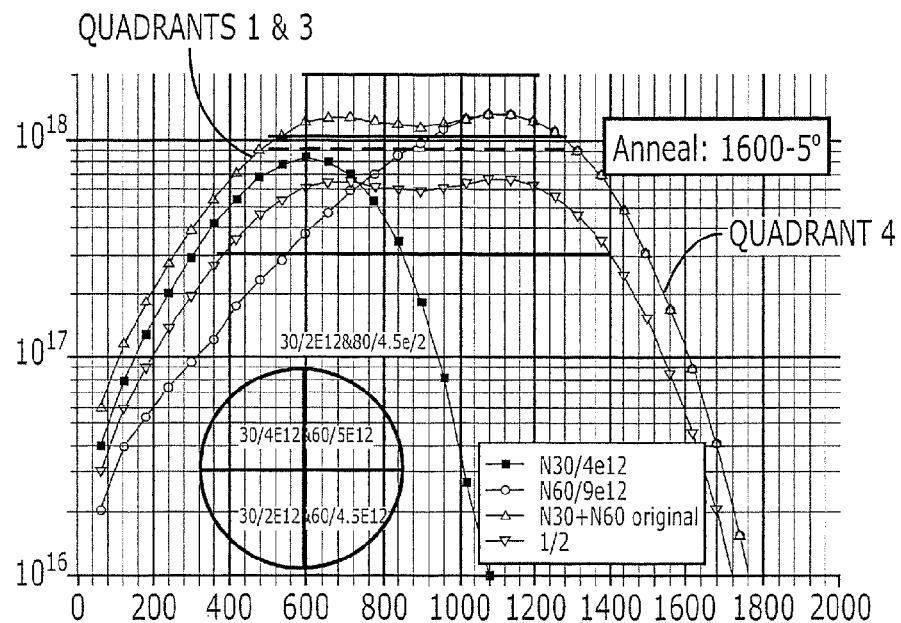
FIG. 12 is a graph of simulated implant concentration profiles for a wafer implanted in accordance with some embodiments of the invention using for different implant conditions.

Simulated implant concentration profiles for Quadrants 1, 3 and 4 are shown in FIG. 12.

Figure 13:
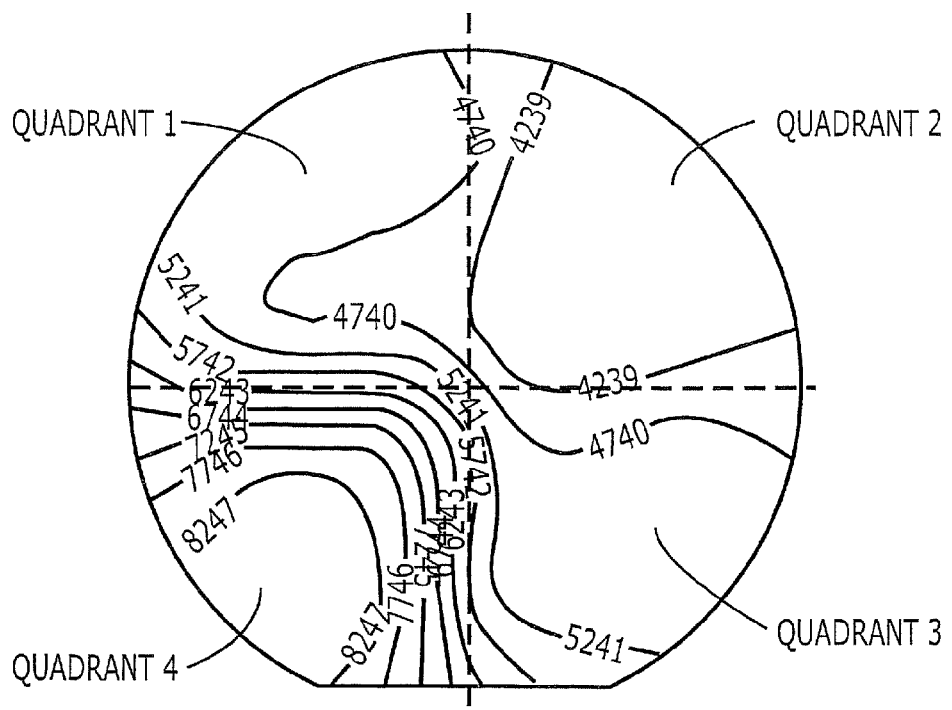
FIG. 13 is a graph of Lehighton sheet resistance data for a wafer implanted using the implant conditions of FIG. 12.

Sheet resistance of the wafers was measured using a Lehighton contactless sheet resistance measurement tool. The Lehighton sheet resistance data is shown in the graph of FIG. 13. The quadrant dependence of the sheet resistance is apparent from the graph shown in FIG. 13. Capacitance-voltage measurements were also performed on the wafer, and charge density and doping were calculated from the C-V measurements. Recesses were etched into the wafer, an the sheet resistance of the channels beneath the recesses was measured. Gates were formed in the recesses, and the pinch-off voltage of the devices was measured. Conductivity mobility was calculated from the channel sheet resistance and the charge density. The Lehighton sheet resistance, charge density, doping and calculated conductivity mobility for the four quadrants is summarized in Table 4.

TABLE 4

Sheet Resistivity, Charge Density, Doping and Mobility

|  | Lehighton $R_{SH}$ (ohms/square) | Charge Density (cm$^{-2}$) | Doping (cm$^{-3}$) | Calculated Mobility (cm$^2$/V-s) |
|---|---|---|---|---|
| Quadrant 1 | 4700 | $8.86 \times 10^{12}$ | $1 \times 10^{18}$ | 150 |
| Quadrant 2 | 4100 | $1.41 \times 10^{13}$ | $2.05 \times 10^{18}$ | 108 |
| Quadrant 3 | 4750 | $8.58 \times 10^{12}$ | $9.21 \times 10^{17}$ | 154 |
| Quadrant 4 | 7500 | $3.49 \times 10^{12}$ | $3.09 \times 10^{17}$ | 237 |

As the data in Table 4 indicate, excellent mobility can be obtained at reasonable doping levels. As seen in Table 4, the implanted quadrants may have a charge density in a range of about $3 \times 10^{12}$ cm$^{-2}$ to about $2 \times 10^{13}$ cm$^{-2}$, and a peak doping in the range of $3 \times 10^{17}$ cm$^{-3}$ to about $2 \times 10^{18}$ cm$^{-3}$. The sheet resistivity may be about 4000 ohms/square to about 7500 ohms/square, and the conductivity mobility may be from about 100 cm$^{-2}$/V-s to about 240 cm$^{-2}$/V-s.

Figure 14:
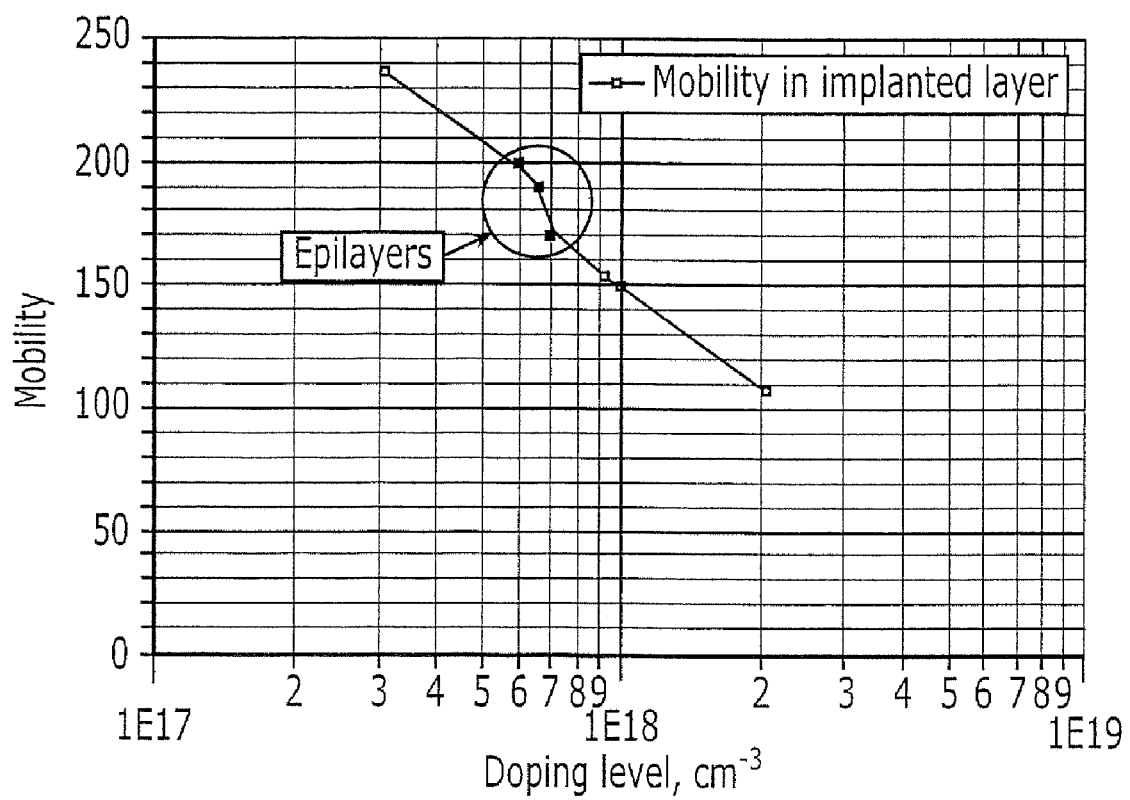
FIG. 14 is a graph of calculated channel mobility versus doping for the wafer of FIG. 13.

FIG. 14 is a graph of calculated channel mobility versus doping for the four quadrants. Also plotted in FIG. 14 for comparison are three typical values of mobility versus doping for epitaxial (non-implanted) channel layers. FIG. 14 illustrates that embodiments of the present invention are capable of producing implanted channel regions having comparable values of mobility versus doping as epitaxial channel layers.

Although the present invention is described above with respect to particular MESFETs having particular layers, regions and recesses, it will be understood that embodiments of the present invention are not limited to the above described MESFETs.

While the present invention is described above with reference to SiC MESFETs, the present invention is not limited to SiC MESFETs. For example, other types of devices may be formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A metal-semiconductor field-effect transistor, comprising:
   a silicon carbide layer having a surface;
   spaced apart source and drain regions in the silicon carbide layer;
   a buried channel region positioned in the silicon carbide layer and beneath the surface of the silicon carbide layer between the source and drain regions and doped with implanted dopants, wherein the silicon carbide layer has a portion thereof disposed between the buried channel region and the surface of the silicon carbide layer along an entirety of the buried channel region; and
   a gate contact on the silicon carbide layer.

2. The transistor of claim 1, further comprising a recess in the silicon carbide layer, wherein the gate contact is positioned in the recess.

3. The transistor of claim 2, wherein the recess extends into the silicon carbide layer by about 600 Å.

4. The transistor of claim 2, wherein the recess extends into the channel region.

5. The transistor of claim 1, wherein the buried channel region has a concentration of implanted dopants of $1 \times 10^{17}$ cm$^{-3}$ or more.

6. The transistor of claim 1, wherein the buried channel region has a peak concentration of implanted dopants in a range of from about $3 \times 10^{17}$ cm$^{-3}$ to about $2 \times 10^{18}$ cm$^{-3}$.

7. The transistor of claim 6, wherein the peak concentration is located in a range of from about 100 nm to about 350 nm from a surface of the silicon carbide layer.

8. The transistor of claim 1, further comprising a cap layer on the channel layer, wherein the gate contact extends through the cap layer to the silicon carbide layer.

9. The transistor of claim 1, wherein the implanted dopants form a dual peak dopant profile in the buried channel layer.

10. The transistor of claim 1, wherein the silicon carbide layer has a thickness of from about 0.5 to about 0.8 μm.

11. The transistor of claim 1, wherein the silicon carbide layer comprises an unintentionally doped silicon carbide layer.

12. The transistor of claim 1, wherein the silicon carbide layer comprises an epitaxial silicon carbide layer.

13. The transistor of claim 1, wherein the silicon carbide layer comprises a bulk silicon carbide layer.

14. The transistor of claim 13, wherein the bulk silicon carbide layer comprises a semi-insulating silicon carbide substrate.

15. The transistor of claim 1, wherein the buried channel region has a conductivity mobility in a range of about 100 cm$^2$/V-s to about 240 cm$^2$/V-s.

16. The transistor of claim 1, wherein the buried channel region has an implant charge density in a range of about $3 \times 10^{12}$ cm$^{-2}$ to about $2 \times 10^{13}$ cm$^{-2}$.

17. The transistor of claim 1, wherein the buried channel region has a peak doping in the range of about $3 \times 10^{17}$ cm$^{-3}$ to about $2 \times 10^{18}$ cm$^{-3}$.

18. The transistor of claim 1, wherein the silicon carbide layer has a sheet resistivity in a range of about 4000 ohms/square to about 7500 ohms/square.

19. A metal-semiconductor field-effect transistor, comprising:
a silicon carbide layer;
spaced apart source and drain regions in the silicon carbide layer;
a buried channel region positioned beneath a surface of the silicon carbide layer between the source and drain regions and doped with implanted dopants, wherein the buried channel region includes a concentration profile of implanted dopants forming a plurality of regions having respective different dopant concentrations, and wherein the silicon carbide layer has a portion thereof disposed between the buried channel region and the surface of the silicon carbide layer along an entirety of the buried channel region; and
a gate contact on the silicon carbide layer.

20. The transistor of claim 19, wherein the buried channel region includes a first sublayer, a second sublayer and a third sublayer disposed between the first and second sublayers, wherein the third sublayer has a dopant concentration less than a dopant concentration of the first sublayer and/or the second sublayer.

21. The transistor of claim 20, wherein the gate contact extends through the first sublayer and into the third sublayer.

22. The transistor of claim 19, wherein the buried channel region comprises a first sublayer having a first dopant concentration and a second sublayer having a second dopant concentration beneath the first sublayer, wherein the first sublayer has a higher dopant concentration than the second sublayer.

23. The transistor of claim 22, wherein the gate contact extends into the first sublayer.

24. The metal-semiconductor field-effect transistor of claim 1, wherein the buried channel region comprises an implanted channel region that is doped with the implanted dopants, and wherein the gate contact is in direct contact with the implanted channel region.

25. The metal-semiconductor field-effect transistor of claim 1, wherein the buried channel region is positioned in the silicon carbide layer between the source region and the drain region.

26. The metal-semiconductor field-effect transistor of claim 19, wherein the buried channel region comprises an implanted channel region that is doped with the implanted dopants, and wherein the gate contact is in direct contact with the implanted channel region.

27. The metal-semiconductor field-effect transistor of claim 19, wherein the buried channel region is positioned in the silicon carbide layer between the source region and the drain region.

28. A metal-semiconductor field-effect transistor, comprising:
a silicon carbide layer;
spaced apart source and drain regions in the silicon carbide layer and extending to a surface of the silicon carbide layer, the source and drain regions having a first conductivity type and defining a channel region in the silicon carbide layer between the source and drain regions; and
a gate contact that is in direct contact with the silicon carbide layer between the source and drain regions;
wherein the channel region comprises a buried channel region that is doped with implanted dopants and wherein the silicon carbide layer has a portion thereof disposed between the buried channel region and the surface of the silicon carbide layer along an entirety of the buried channel region.

29. The metal-semiconductor field-effect transistor of claim 28, wherein the silicon carbide layer comprises a semi-insulating layer.

30. The metal-semiconductor field-effect transistor of claim 28, wherein the buried channel region comprises an implanted channel region that is doped with the implanted dopants, and wherein the gate contact is in direct contact with the implanted channel region.

* * * * *

UNITED STATES PATENT AND TRADEMARK OFFICE
CERTIFICATE OF CORRECTION

| | |
|---|---|
| PATENT NO. | : 8,049,272 B2 |
| APPLICATION NO. | : 11/735799 |
| DATED | : November 1, 2011 |
| INVENTOR(S) | : Henning et al. |

Page 1 of 1

It is certified that error appears in the above-identified patent and that said Letters Patent is hereby corrected as shown below:

In the Patent:

Column 12, Line 67: Please correct "about 100°C." to read -- about 1100°C. --

Column 16, Line 30: Please correct "100 $cm^{-2}$/V-s" to read -- 100 $cm^2$/V-s --
and correct "240 $cm^{-2}$/V-s" to read -- 240 $cm^2$/V-s --

Signed and Sealed this
Sixth Day of March, 2012

David J. Kappos
*Director of the United States Patent and Trademark Office*